United States Patent Office 2,846,294

Patented Aug. 5, 1958

2,846,294

ETCHING BATH

Robert G. Patterson, Brooklyn, and Yoshikazu Yamada, Long Island City, N. Y., assignors to Mergenthaler Linotype Company, a corporation of New York No Drawing. Application October 8, 1956
Serial No. 614,336

19 Claims. (Cl. 41—42)

This invention relates to etching baths useful in the production of metallic relief plates and to a method of etching light-exposed relief plates for use in printing.

The metal plates used in non-planographic reproduction processes when ready for use contain in relief the image which is to be printed. In letter-press printing the ink is transferred from the raised portions of the printing surface, just as in printing with ordinary type. In gravure or intaglio printing, the ink is transferred to the paper from the depressed portions of the printing surface. The plates used in these processes are collectively termed engraved or relief printing plates herein. In such plates, the formation of the relief image in the plate requires an etching step, which naturally is an essential part of the procedure for preparation of the plate.

The plates employed are of metal, usually of zinc or magnesium alloy, and are coated with a photosensitive resist composition which initially is soluble in certain solvents or solvent solutions used for subsequent development after exposure but when exposed to light this coating becomes insoluble in such solutions. Thus, during development of a coated plate which has been exposed to light through a photo-mechanical negative or positive, the opaque areas of the negative or positive through which light did not pass are washed out because they remain soluble in the developer, exposing the naked metal base of the plate in such areas, while the rest of the plate remains coated. These bare areas correspond with the outlines of the image, and, depending on whether the image is a negative or a positive, after etching either will become the image itself or will define the image.

The next step is to etch the bare surface of the metal in such areas so as to form the image in relief. Nitric acid is generally used for etching zinc and magnesium alloy plates. It is essential that the edges of the image be sharp and well defined if the final plate is to print the image cleanly. However, the etching process is difficult to control, because it proceeds wherever bare metal lies exposed to the acid. Thus, as the etching process continues, the etching solution etches not only deeper into the plate but also deeper into the edges of the image. Such sidewise etching is called lateral attack, and may result in undercutting or in a widening of the etch at the top, or both. Since lateral attack at the top of the etch changes the physical size outline of the image itself, it is of course to be avoided, if at all possible. It has therefore been the object of the art for many years to reduce the lateral attack of acid etching solutions, but it cannot be said that any of the methods suggested are entirely successful.

To indicate the extent of lateral atack upon the plate in photoengraving the term "etch factor" has been introduced. The etch factor is a measure of the degree of lateral attack by the etching bath. It is the ratio of the depth of the etch, measured along a line perpendicular to the resist to the deepest part at the edge of the etch, to the average loss in width of metal on that side of the image, measured laterally at the top of the surface of the metal beneath the line of the resist. The etch factor is expressed by the formula $$e.f.=\frac{\text{depth}}{\text{lateral loss}}$$

The customary way to minimize lateral attack is to etch in small "bites," using a series of etching steps. In the first etch, after a slight relief has been built up, the plate is removed from the etching solution, washed and dried, and a resin or wax, or both, then applied to the edges of the relief image. A natural resin, such as dragon's blood, or a synthetic resin, such as Bakelite, or a synthetic product, such as a mixture of wax, resin and aniline dye, usually are used. These are melted or "banked" into the lateral areas by holding the plate over a hot flame. The plate when immersed a second time in the etching bath now will be protected from lateral attack to a certain extent by the coating of the resin. However, it is apparent that this procedure has many disadvantages. The resin coating must be carefully applied, so as not to adhere to the areas of the plate which must be etched still deeper. Moreover, in a short time, as the etch deepens, more bare areas subject to lateral attack are exposed, so that the protective coating loses its value, and a new coating is needed. Thus, a new "bank-in" or "burn-in" follows. An etch of the normal depth may require 4 to 7 etches and "bank-ins" or "burn-ins" of this type. Approximately 66 minutes is required for preparation of a plate using 4 "burn-ins."

The time and labor thus required to produce deep etches constitutes a considerable nuisance to the trade, and many efforts have been made to overcome the necessity of using dusting powders. Such efforts have led to the proposal that there be included in the acid bath certain agents which coat upon the metal an acid-resistant film which tends to protect the surface of the metal from acid attack during the etching process. Since the etching bath completely covers the area to be etched, however, so also does the removable acid-resistant film that is deposited from the etching bath. Unless deposition is controlled, the film therefore may slow down the etch not only in the areas where lateral attack may take place but also in the areas which it is desired to etch. The problem thus becomes one of controlling the extent of deposition of the acid-resistant film, and the nature and stability of the film that is formed, so that a proper film is deposited in the areas where lateral attack is to be prevented, but is not deposited sufficiently in the areas to be etched. In this ideal situation, the film would prevent lateral attack but would not materially inhibit etching where desired.

This ideal is, however, quite difficult to realize. The extent of deposition and the nature and stability of the acid-resistant film are dependent upon the material used for the film, upon the stability of its dispersion in the acid etching bath, and upon the degree of circulation of the fluid etching medium.

Obviously, the dispersion cannot be completely stable, since then no film would be deposited. On the other hand, the dispersion cannot be too unstable, since then the film would be formed unevenly. The nicety of adjustment of the stability of the dispersion is a serious problem, dependent as it is upon the nature of the film material and upon the emulsifying agent used in the bath to form the dispersion.

Another method of controlling the extent of deposition, as stated, is by the customary artificial circulation of the etching bath media. The theory of this is that the more open areas of the etch will receive the greatest amount of circulation, because they are open, while the edges and corners of the open areas, where lateral attack occurs, will receive less circulation, and therefore a larger amount of the film which is deposited will be retained on the metal surface in such areas, slowing the etch more there. Unfortunately, however, there is much fine detail in a relief plate in relatively enclosed areas, such as the centers of letters—g's, a's, o's, e's, and the like. In these areas, circulation alone is not adequate to give a good etch, since it is very easy for the film-forming agent to be deposited uniformly there, and to remain there despite circulation. Hence, the rate of etch may be slower here than elsewhere. In these areas, since circulation of the etching bath is not adequate for a good etch, the only factors which come into play are the relative effectiveness of the film-forming agent, and the stability of the dispersion of the film-forming agent in the etching bath. These factors, as previously stated, are quite difficult to control, and it has not yet been possible to do so to obtain an adequate etch in such enclosed areas.

Several U. S. patents, dated June 2, 1953, have issued to Easley and Swayze, disclosing various types of film-forming agents which can be used to exert a protective coating against lateral attack by the etching bath. No. 2,640,763 suggests the use of saturated aliphatic acids having from 5 to 26 carbon atoms. No. 2,640,764 suggests the use of esters of aliphatic acids having from 12 to 18 carbon atoms and polyhydric aliphatic alcohols having from 2 to 6 carbon atoms. No. 2,640,765 uses water-immiscible organic materials liquid at ordinary temperatures or liquefied below the temperature at which the etching bath is normally used, and substantially unreactive with the nitric acid solution, esters of sulfosuccinic acid and an aliphatic alcohol having from 4 to 12 carbon atoms. As illustrative, it suggests the various petroleum fractions boiling in the range of 90 to 390° C., including kerosene, coal oil, benzine, gasoline, and lubricating oils. No. 2,640,766 utilizes esters of sulfosuccinic acid and an aliphatic alcohol having from 4 to 12 carbon atoms. No. 2,640,767 utilizes petroleum oil fractions boiling in the range of 90° to 93° C., as does No. 2,640,765, with a petroleum sulfonate in order to assist in dispersing the petroleum oil.

These patents treat etch factor as though it were the only criterion of the optimum etch. The etch factor is not adequate to define the actual printability of the finished plate. The optimum shoulder angle for printability has been established at 11° from the perpendicular, facing down, which itself limits the possible depth of etch in the counter areas. The etch factor does not take this optimum angle into account. Also, for optimum printability, there are optimum depths of etch for various areas of the plate, depending upon the extent of their enclosure.

Moreover, none of these patents appreciates the significance of the stability of the emulsion in the control of the rate of etch in the enclosed areas of the plate. Although wetting agents are used in Nos. 2,640,765 and 2,640,767, each of the wetting agents which are employed itself has film-forming properties. The sulfosuccinic acid esters are themselves capable of minimizing lateral attack, and are the subject of No. 2,640,766. According to No. 2,640,767, the petroleum sulfonates and the petroleum oil fractions together act to reduce the etching action of the acid. Thus, the function of each of the wetting agents employed in these patents is also to reduce the rate of etch by the formation of this film, and the differential control needed to prevent lateral attack is obtained by the agitation of the etching solution during the etching. This is not adequate, for the reasons stated, to obtain a satisfactory rate of etch while preventing lateral attack in the areas of the plate which are relatively protected due to their small dimensions, such as the interiors of the letters a, o, g, e, and the like.

In order to obtain an increase in the rate of etch in the enclosed areas, it is necessary to add an anti-film-forming material, such as gelatin, to these baths.

In accordance with the instant invention, an etching bath is provided which substantially eliminates lateral attack by the etching solution, and yet at the same time gives the desired depth development throughout all of the areas of the plate, according to their configuration, or the extent to which they are open or enclosed. The etching bath of the invention does not materially slow the rate of etch. The etching bath of the invention is based upon the principle that the stability of the emulsion and the nature and stability of the film formed on the surface of the metal are each quite significant, and are controlled by the surfactant.

The nature and stability of the film formed upon the metal surface are very difficult to measure, and equally difficult to control. Here, the nature of the surfactant and of the film each play a part. Heretofore, such factors have not been taken into account in controlling the rate of etch and the extent of lateral attack. They are utilized in the etching bath of the invention to overcome the difficulties attending use of prior baths of the film-forming type in obtaining a satisfactory depth of etch in enclosed areas while minimizing lateral attack.

The etching baths of the invention contain as the film-forming agent a water-immiscible petroleum hydrocarbon fraction which is substantially nonvolatile under the etching conditions, that is, at the temperature of the etching bath. It should therefore have a minimum boiling point in the range of 70 to 90° C. There is no upper limit on the maximum boiling point, but as their boiling point increases, petroleum fractions tend to become more viscous, and accordingly more difficult to disperse in aqueous suspensions and maintain in uniform suspension throughout the etching time. The upper limit therefore is established by the viscosity and ease of dispersion or emulsibility of the petroleum hydrocarbon employed, and will usually be about 390° C. Aliphatic, aromatic and cycloaliphatic fractions can be used, as well as mixtures thereof, for example, kerosene, gasoline, benzine, coal oil and lubricating oil fractions. Various aromatic hydrocarbons and chlorinated aromatic hydrocarbons, for example, the diethyl benzenes, also can be used. Turpentine is useful, as well as chlorinated aliphatic hydrocarbons such as perchloroethylene.

As the nonfilm-forming surfactant there is employed an alkyl sulfate having fourteen carbon atoms, i. e., a tetradecyl sulfate $C_{14}H_{29}SO_4M$, where M is a metal cation, preferably an alkali metal, e. g., sodium or potassium or ammonium. The preferred compound is sodium 7-ethyl-2-methyl-undecane-4-sulfate,

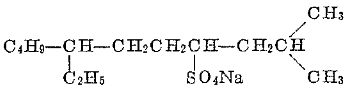

available as a 25% aqueous solution. This substance has a remarkable effect upon the film-forming properties of the film-forming agent. Addition of the petroleum hydrocarbon alone to the etching bath has only a slight effect on the etch factor. When the proper amount of the sodium 7-ethyl-2-methyl-undecane-4-sulfate is added, the etch factor can be increased by as much as ten times.

As an optional ingredient, the etching baths in accordance with the invention can also contain a substituted 1,1,4,4-tetraalkyl-2-butyne-1,4-diol nonionic surfactant. These are defined by the general formula

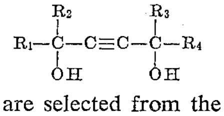

where $R_1$ and $R_4$ are selected from the group consisting of alkyl radicals having from 4 to 14 carbon atoms, for example, butyl, decyl, lauryl, and palmityl, and $R_2$ and $R_3$ are selected from the group consisting of alkyl radicals having from 1 to 5 carbon atoms, for example, methyl, ethyl, propyl, butyl, and amyl. These substances are available in commerce under the trademark Surfynol.

The following are illustrative of compounds which have been tried in the etching baths of the invention, and have been found very satisfactory:

*5,8-dimethyl-6-dodecyne-5,8-diol*

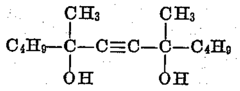

*13,16-dimethyl-14-octacosyne-13,16-diol*

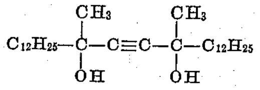

*15,18-dimethyl-16-dotriacontyne-15,18-diol*

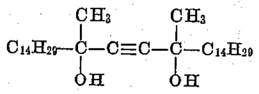

These nonionic surfactants have the effect of increasing the rate and character of etch in the presence of the tetradecyl sulfate, when the amount of the latter is low, so that they also tend to improve the action of the etching bath in the enclosed areas, such as the centers of small letters, so that these reach an adequate depth of etch at the same time as do the larger more open areas. With this, they also further reduce lateral attack to approximately nil.

The etching baths of the invention are surprisingly sensitive to the amounts of these two wetting agents. When the tetradecyl sulfate is employed alone, it should be in an amount within the range from 0.2 to 2.5% by weight of the nitric acid, calculated as $HNO_3$. Amounts in the lower part of this range are satisfactory in the etching of magnesium plates but somewhat more of the tetradecyl sulfate is required in the etching of zinc plates. Thus, amounts within the range from 0.2 to 0.8% by weight of the nitric acid are preferred in the etching of magnesium plates, while amounts within the range from 1 to 2.5% by weight are preferred in the etching of zinc plates. The etching bath has little or no inhibiting effect upon lateral attack when the tetradecyl sulfate is present in an amount less than 0.2%. On the other hand, in amounts in excess of 2.5%, etching may be inhibited or prevented.

The amount of the 2-butyne nonionic surfactant is somewhat less critical. In fact, it can be omitted, if desired. When used, it will be in an amount within the range from 0.05 to 3.75% by weight of the nitric acid, calculated as $HNO_3$.

It has been observed that the amount of the 2-butyne surfactant which should be used should be in proportion to the tetradecyl sulfate such that the ratio of the 2-butyne surfactant to tetradecyl sulfate is not in excess of 1.5 and preferably at least 0.025. Thus, the amount of the 2-butyne surfactant will be selected from within the range of 0.05 to 3.75% by weight of the nitric acid, keeping in mind this ratio. It will also be noted that the amount of the 2-butyne surfactant required in the etching of the magnesium is somewhat less than is required in the etching of zinc plates. Thus, the preferred range in the etching of magnesium plates is from 0.05 to 1.2% by weight of the nitric acid, and in the etching of zinc plates the preferred range is from 0.25 to 3.75% by weight of the nitric acid.

The above amounts are based upon the amount of nitric acid in the bath, because the rate of etch itself depends upon the acid concentration, and these additives are added to control the rate of etch in selected areas. Hence, the amount of wetting agent which is used will always depend upon the acid concentration.

The etching bath of the invention is a dispersion or emulsion of the film-forming agent in the aqueous acid solution with the aid of the wetting agent or agents. It is important that the etching bath emulsion not be too stable. If the emulsion is too stable, the protective film which it is desired to form on the surface of the metal will not be formed, or if formed it will not give sufficient control of the etch in the desired areas. Hence, the amounts of wetting agent will be selected from the above range to give an emulsion which fully separates into two layers, constituting the aqueous layer and the petroleum hydrocarbon fraction layer, within from ½ to 1½ minutes after stirring is stopped.

The petroleum hydrocarbon fraction may be used in an amount in a more extended range, and the amount is not critical, but would be used in proportion to the desired effect. The range would usually be within from 1 to 75% by volume of the nitric acid solution, preferably from 5 to 25%. Factors to be taken into consideration are the type of metal used, the depth of the etch, the type of etch, that is, the size type and the character of the image, and the concentration.

The concentration of the acid will be dependent upon the metals constituting the plate, as those skilled in the art are aware. The range will be from 3 to 25% by weight of the solution in most cases. For magnesium and magnesium alloy plates the nitric acid solution preferably will be approximately 10 to 13% in strength, while for zinc plates, the nitric acid solution preferably will be about 15% to 20%.

The etching bath also can contain antifoaming agents, such as silicone resin emulsions, to reduce foam. However, when the 2-butyne nonionic surfactant is present, antifoamers are unnecessary.

The types of photosensitive resists which can be used on printing plates are of course limited, and the organic petroleum hydrocarbon which is employed will be selected with a view to avoiding attack upon the resist. The diethyl benzenes, for example, are good solvents for the sensitized polyvinyl cinnamic acid esters which are the subject of U. S. Patents Nos. 2,610,120, 2,670,285, 2,690,966, 2,670,287, and 2,739,892. Consequently, when resists of this type are being employed, kerosene and the aliphatic petroleum hydrocarbons are preferable. On the other hand, diethyl benzene can be used with other types of resists, such as the bichromated colloid resists.

The following examples in the opinion of the inventors represent the best embodiments of their invention.

*Example 1*

An etching bath was prepared of the following composition:

| | | |
|---|---|---|
| Nitric acid (42° Baumé) | l | 20.4 |
| Kerosene | l | 16 |
| Sodium 7-ethyl-2-methyl-undecane-4-sulfate (25% aqueous solution) | ml | 1700 |
| Surfynol 104[1] (50% solution in ethylene glycol by weight) | ml | 282 |

Water to make 136 l.

[1] A mixture of predominantly 13,16-dimethyl-14-octacosyne-13,16-diol and 15,18-dimethyl-16-dotriacontyne-15,18 diol.

A presensitized zinc alloy printing plate, the alloy containing zinc with 0.0002% cadmium, 0.0008% iron, 0.0008% lead, 0.0009% copper and 0.0015% magnesium, coated with a light-sensitive resist composition, was exposed under a line image at 4 feet from a 75 ampere white flame carbon arc for about 3 minutes. The result of the exposure was to insolubilize the resist in the exposed region in the 50–50 mixture of methyl ethyl ketone and acetone used in the development. After exposure, development was carried out for 2 minutes in a tray 50% methyl ethyl ketone and 50% acetone, dissolving the light-unexposed soluble areas of the plate and leaving a resin resist on the plate with the metal areas from which the resin and sensitizer had been removed remaining, exposing the bare metal.

The plate was then ready for etching in order to obtain a letterpress relief plate. The plate was scummed out in dilute nitric acid solution, rinsed and then etched in the etching bath, using a Master-Dow machine for a total of 5 minutes, 1 minute at 700 R. P. M. and 4 minutes at 400 R. P. M. The plate was then removed from the bath, rinsed and dried.

The etch depth was 0.010 inch. The edges of the etch were cleaned and free from undercutting. There was good shoulder buildup along the image.

The total time required to prepare the plate, including exposure and development, was 17 minutes as compared to 66 minutes required for the conventional process using a series of etches and "burn-ins."

*Example 2*

A variation of the bath of Example 1 was prepared having the following composition:

| | | |
|---|---|---|
| Nitric acid (42° Baumé) | l | 21 |
| Kerosene | l | 16 |
| Sodium-7-ethyl-2-methyl-undecane-4-sulfate (25% aqueous solution) | ml | 1000 |
| Surfynol 104[1] (50% solution in ethylene glycol by weight) | ml | 166 |
| Water to make 136 l. | | |

[1] A mixture of predominantly 13,16-dimethyl-14-octacosyne-13,16-diol and 15,18-dimethyl-16-dotriacontyne-15,18 diol.

This solution was used in a Master-Dow etching machine to etch a developed zinc plate bearing a Magtop resist of the hot-top type composed of a mixture of polyvinyl alcohol, fish glue and ammonium dichromate. The etch time was 6 minutes, 2 minutes at 800 R. P. M., 4 minutes at 600 R. P. M., and the etch depth, 0.014 inch. There was no lateral loss and the image was etched in sharp relief in the plate.

*Example 3*

A series of six etching baths were prepared of the following formulation:

| | |
|---|---|
| Nitric acid (42° Baumé) | 300 ml. |
| Water | 1800 ml. |
| Kerosene | 300 ml. |
| Sodium 7-ethyl-2-methyl-undecane-4-sulfate (25% aqueous solution) | Amount indicated in the table below. |

Each of these baths was used to etch magnesium alloy plates, the alloy being primarily magnesium with 2% aluminum and 1% zinc, with a trace of cadmium, coated with a resist in accordance with the example of U. S. Patent No. 2,610,120, consisting essentially of a polyvinyl cinnamic acid ester, sensitized with a small amount of 2,4,6-trinitroaniline. The plate was exposed through a negative containing line images at 4 feet from a 75 ampere white flame carbon arc for about 5 minutes, and developed in methyl ethyl ketone to remove the unexposed soluble resist areas. The plates were scummed out in dilute nitric acid, rinsed and then etched for the times indicated in a miniature four paddle equipped etching machine to the depths indicated in the table below. The etch factors were calculated from the observed lateral attack of the etched plates.

| Amount of Sodium 7-ethyl-2-methyl-undecane-4-sulfate | | Etch Factor | Etch Time (Seconds) | Etch Depth (Inch) |
|---|---|---|---|---|
| Volume (ml.) | Percent by weight of $HNO_3$ | | | |
| Control—none | Control—none | 2.8 | 120 | 0.011 |
| 1.5 | 0.139 | 3.2 | 120 | 0.012 |
| 2.0 | 0.185 | 3.3 | 120 | 0.012 |
| 2.25 | 0.208 | 30.3 | 120 | 0.0115 |
| 2.5 | 0.231 | 11.0 | 150 | 0.005–0.009 |
| 3.0 | 0.278 | 9.8 | 300 | 0.010–.011 |

It is apparent from the above results that in amounts up to 2 ml. of the 25% solution (0.185%), the sodium 7-ethyl-2-methyl-undecane-4-sulfate did not effect any improvement over the control. A considerable improvement, however, was obtained at the 2.25 ml. level. Here the amount of lateral loss was 1/10 that of the previous amount. Thus, the proportions of this compound are quite critical in minimizing lateral loss. At least 0.2% is required to achieve a satisfactory result. As the amount increases beyond this, the etch factor again decreases, and gradually approaches the values obtained with less than 0.2% of the sodium 7-ethyl-2-methyl-undecane-4-sulfate.

Using the above procedure, there were also tested sodium octyl sulfate, sodium oleyl sulfate, sodium 2-ethyl-hexane-1-sulfate, sodium cetyl sulfate, sodium lauryl sulfate, and sodium 9-ethyl-3-ethyl-tridecane-6-sulfate, using the same amounts as in the table above. The etch factor when the plate was etched to a 0.008 to 0.011 inch depth was no better than the nitric acid alone.

*Example 4*

The following experiment shows that the 2-butyne nonionic surfactant is not effective when $R_1$ and $R_4$ of the formula in column 4, lines 65–68 have less than four carbon atoms. An etching bath was prepared containing 300 ml. of nitric acid (42° Baumé), 1800 ml. of water and 300 ml. kerosene. The bath was used to etch a magnesium alloy plate prepared by light exposure in accordance with Example 3, using the same etching machine. The etch depth was 0.009 inch and the etch factor 2.5. The etch time was 105 seconds.

To this bath was added 3 ml. of a 25% aqueous solution of 7-ethyl-2-methyl-undecane-4-sulfate. The solution then was used to etch another plate in the same machine, this time for an etch time of 180 seconds. The etch depth was 0.017 inch, and the etch factor 50, showing that the etch had clean edges and that there was very little lateral loss.

To the bath was then added 3 ml. of a solution of 5 grams of 3,6-dimethyl-5-octyne-3,6-diol in 50 cc. of acetone. This bath was then used to etch a third magnesium alloy plate prepared by light exposure in accordance with Example 3, this time for an etch time of 180 seconds. The etch depth was 0.008 inch and the etch factor 6.5.

It is apparent that this 2-butyne surfactant overcame the beneficial effect of the sodium 7-ethyl-2-methyl-undecane-4-sulfate. The etch factor was so slightly better than the control without any wetting agent, as to represent substantially no improvement thereover.

*Example 5*

Two etching baths were prepared, one containing 300 ml. nitric acid (42° Baumé), 300 ml. kerosene, 1800 ml. water and 3 ml. of a 25% solution of sodium 7-ethyl-2-methyl-undecane-4-sulfate. The second bath was prepared by adding to the first, after etching was complete, 1.7 ml. of Surfynol 102, a solution of 25 grams of 5,8-dimethyl-6-dodecyne-5,8-diol in 50 cc. of acetone. Each of the baths were used in sequence to etch the magnesium alloy plate of Example 3 coated with the resist coating described in the example of U. S. Patent No. 2,610,120, which had been previously exposed through a negative containing line images and developed in a 50–50 solution of methyl ethyl ketone and acetone. The following results were obtained:

| | Etch Factor | Etch Depth (Inch) | Etch Time (Seconds) |
|---|---|---|---|
| Bath containing sodium 7-ethyl-2-methyl-undecane-4-sulfate only | 40 | 0.008 | 150 |
| Bath containing sodium 7-ethyl-2-methyl-undecane-4-sulfate and 5,8-dimethyl-6-dodecyne-5,8-diol | (1) | 0.011 | 110 |

[1] No measurable lateral loss—less than one micron.

It is apparent from the above results that the nonionic surfactant increases the rate of etch, improves the background areas, and actually improves the etch factor in so doing.

*Example 6*

A series of etching baths were prepared containing a 25% aqueous solution of sodium 7-ethyl-2-methyl-undecane-4-sulfate, and Surfÿnol 104, a 50% solution in ethylene glycol of 13,16-dimethyl-14-octacosyne-13,16-diol with 15,18-dimethyl-16-dotriacontyne-15,18-diol.

The etching baths were of the following formulation:

| | |
|---|---|
| Nitric acid (42° Baumé) | 300 ml. |
| Water | 1800 ml. |
| Kerosene | 300 ml. |
| Surfactant | The amount given in the table below. |

These baths were used to etch magnesium alloy plates which had been coated with a resist composition of the example of Patent No. 2,610,120, exposed through an image containing line image developed in methyl ethyl ketone and acetone, rinsed, and dried. The following results were obtained:

| Sodium 7-ethyl-2-methyl-undecane-4-sulfate | | | Surfÿnol 104 | | Etch Factor | Etch Time (Sec.) | Etch Depth (Inch) |
|---|---|---|---|---|---|---|---|
| Bath | Volume (ml.) | Percent by weight of $HNO_3$ | Volume (ml.) | Percent by weight of $HNO_3$ | | | |
| A | 0 | ---------- | 0 | ---------- | 3 | 120 | 0.011 |
| B | 1.5 | 0.139 | 0 | 0 | 3.4 | 120 | 0.011 |
| C | 1.5 | 0.139 | 0.4 | 0.069 | 3.0 | 120 | 0.011 |
| D | 2.0 | 0.185 | 0 | 0 | 6.7 | 120 | 0.011 |
| E | 2.0 | 0.185 | 0.5 | 0.087 | 4.2 | 120 | 0.011 |
| F | 2.25 | 0.208 | 0 | ---------- | 43 | 120 | 0.011 |
| G | 2.25 | 0.208 | 0.56 | 0.097 | 34 | 120 | 0.011 |
| H | 2.5 | 0.231 | 0 | 0 | 18 | 120 | 0.006-0.0095 |
| I | 2.5 | 0.231 | 0.62 | 0.108 | 32 | 120 | 0.010 |

It is apparent from the above results that the Surfÿnol 104 cannot improve the etch factor by itself. Adding this surfactant to the sodium 7-ethyl-2-methyl-undecane-4-sulfate solution has no beneficial effect upon etch factor where the latter surfactant is not present in a sufficient amount to reduce it itself, that is, in the case where it is present in too small an amount, in baths A through E. When the amount of the sodium 7-ethyl-2-methyl undecane-4-sulfate is sufficient to materially improve the etch factor, however, as in F and H, the Surfÿnol 104 tends to "level out" the etch factor at values intermediate those with the alkyl sulfate, thus making the etch factor easier to control so that it is not as sensitive to small variations in the amount of the sodium 7-ethyl-2-methyl-undecane-4-sulfate.

*Example 7*

An etching bath was prepared containing 300 ml. nitric acid (42° Baumé), 300 ml. kerosene, 1800 ml. water, and 3.75 ml. of a 25% aqueous solution of sodium 7-ethyl-2-methyl-undecane-4-sulfate. This bath was used to etch a magnesium alloy plate, the alloy being primarily magnesium with 2% aluminum and 1% zinc and a trace of cadmium, coated with a resist in accordance with the example of U. S. Patent No. 2,610,120, consisting essentially of polyvinyl cinnamic acid ester sensitized with a small amount of 2,4,6 trinitroaniline. The plate was exposed through a negative containing line images at 4 feet from a 75 ampere white flame carbon arc for about 5 minutes and developed in methyl ethyl ketone to remove the unexposed soluble resist areas. The plate was scummed out in dilute nitric acid, rinsed and then etched for 130 seconds in a miniature four paddle equipped etching machine. At the end of this time, the etch depth in the clear or open areas was 0.00115 inch, the average in the areas enclosed within the letter o's was 0.0047 inch, and the average depth within the enclosed portion of the letter e's was 0.0038 inch.

To this bath was then added 0.4 cc. of Surfÿnol 104, a 50% solution in ethylene glycol of a mixture of 13,16-dimethyl-14-octacosyne-13,16-diol with 15,18-dimethyl-16-dotriacontyne-15,18-diol. The bath was then used to etch another magnesium alloy plate, exposed, developed, scummed and rinsed by the same procedure as before. The plate was etched in this bath for 130 seconds. At the end of this time, the average depth in the clear or open areas was 0.0082 inch, the average depth in the enclosed o's was 0.0051 inch and the average depth in the enclosed e's was 0.0043 inch. It is apparent that the Surfÿnol greatly increased the depth in the enclosed areas while reducing the depth in the open areas, making these more equal. However, the plate obtained using the undecane sulfate alone was perfectly acceptable for printing, although the plate obtained using the Surfÿnol in addition was better.

The addition of the Surfÿnol to the undecane sulfate not only greatly deepened the etch in the interior of the letter, but also aided the shoulder angle.

In the claims, all percentages of the wetting agents are by weight of the nitric acid, calculated as $HNO_3$, and all percentages of the petroleum fraction are by volume of the nitric acid solution.

We claim:

1. An etching bath comprising an aqueous dispersion containing nitric acid, from 0.2 to 2.5% of a water-soluble salt of a tetradecyl sulfate, and from 1 to 75% of a water-immiscible liquid petroleum fraction boiling in the range from 70 to 390° C.

2. An etching bath in accordance with claim 1 in which the tetradecyl sulfate is sodium 7-ethyl-2-methyl-undecane-4-sulfate.

3. An etching bath in accordance with claim 1 in which the pertoleum fraction is kerosene.

4. An etching bath in accordance with claim 1 which comprises from 0.05 to 3.75% of a 1,1,4,4-tetraalkyl-2-butyne-1,4-diol having the formula:

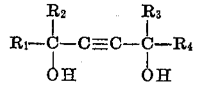

in which $R_1$ and $R_4$ are selected from the group consisting of alkyl radicals having from 4 to 14 carbon atoms, and $R_2$ and $R_3$ are selected from the group consisting of alkyl radicals having from 1 to 5 carbon atoms.

5. An etching bath in accordance with claim 4 in which the 2-butyne compound is

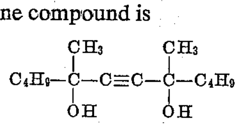

6. An etching bath in accordance with claim 4 in which the 2-butyne compound is

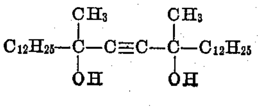

7. An etching bath in accordance with claim 4 in which the 2-butyne compound is

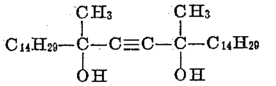

8. An etching bath comprising an aqueous dispersion containing from 3 to 25% nitric acid, from 0.2 to 0.8% of an alkali metal salt of a tetradecyl sulfate, and from 5 to 25% of a water-immiscible liquid petroleum fraction boiling in the range from 70 to 390° C.

9. An etching bath in accordance with claim 8 comprising from 0.05 to 1.2% of a 1,1,4,4-tetraalkyl-2-butyne-1,4-diol having the formula:

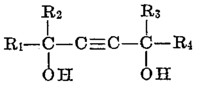

in which $R_1$ and $R_4$ are selected from the group consisting of alkyl radicals having from 4 to 14 carbon atoms, and $R_2$ and $R_3$ are selected from the group consisting of alkyl radicals having from 1 to 5 carbon atoms.

10. An etching bath comprising an aqueous dispersion containing from 3 to 25% nitric acid, from 1 to 2.5% of an alkali metal salt of a tetradecyl sulfate, and from 5 to 25% of a water-immiscible liquid petroleum fraction boiling in the range from 70 to 390° C.

11. An etching bath in accordance with claim 10 comprising from 0.25 to 3.75% of a 1,1,4,4-tetraalkyl-2-butyne-1,4-diol having the formula:

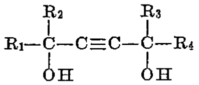

in which $R_1$ and $R_4$ are selected from the group consisting of alkyl radicals having from 4 to 14 carbon atoms, and $R_2$ and $R_3$ are selected from the group consisting of alkyl radicals having from 1 to 5 carbon atoms.

12. An etching bath comprising an aqueous dispersion containing from 3 to 25% nitric acid, from 5 to 25% kerosene, and from 0.2 to 0.8% sodium 7-ethyl-2-methyl-undecane-4-sulfate.

13. An etching bath comprising an aqueous dispersion containing from 3 to 25% nitric acid, from 5 to 25% kerosene, and from 1 to 2.5% sodium 7-ethyl-2-methyl-undecane-4-sulfate.

14. An etching bath comprising an aqueous dispersion containing from 3 to 25% nitric acid, from 5 to 25% kerosene, from 0.2 to 0.8% sodium 7-ethyl-2-methyl-undecane-4-sulfate and from 0.05 to 1.2% of a 1,1,4,4-tetraalkyl-2-butyne-1,4-diol having the formula

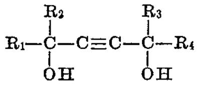

in which $R_1$ and $R_4$ are selected from the group consisting of alkyl radicals having from 4 to 14 carbon atoms, and $R_2$ and $R_3$ are selected from the group consisting of alkyl radicals having from 1 to 5 carbon atoms.

15. An etching bath comprising an aqueous dispersion containing from 3 to 25% nitric acid, from 5 to 25% kerosene, from 1 to 2.5% sodium 7-ethyl-2-methyl-undecane-4-sulfate and from 0.25 to 3.75% of 1,1,4,4-tetraalkyl-2-butyne-1,4-diol having the formula

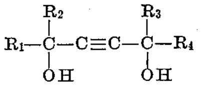

in which $R_1$ and $R_4$ are selected from the group consisting of alkyl radicals having from 4 to 14 carbon atoms, and $R_2$ and $R_3$ are selected from the group consisting of alkyl radicals having from 1 to 5 carbon atoms.

16. A process for etching the exposed metal areas of developed metallic printing plates coated in selected areas with a protective resist, which comprises subjecting the plate to the action of an etching bath comprising an aqueous dispersion containing nitric acid, from 0.2 to 2.5% of a water-soluble salt of a tetradecyl sulfate, and from 1 to 75% of a water-immiscible liquid petroleum fraction boiling in the range from 70 to 390° C.

17. A process in accordance with claim 16 in which the tetradecyl sulfate is sodium 7-ethyl-2-methyl-undecane-4-sulfate.

18. A process in accordance with claim 16 in which the petroleum fraction is kerosene.

19. A process in accordance with claim 16 in which the bath also comprises from 0.05 to 3.75% of a 1,1,4,4-tetraalkyl-2-butyne-1,4-diol having the formula

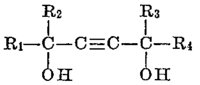

in which $R_1$ and $R_4$ are selected from the group consisting of alkyl radicals having from 4 to 14 carbon atoms, and $R_2$ and $R_3$ are selected from the group consisting of alkyl radicals having from 1 to 5 carbon atoms.

References Cited in the file of this patent

UNITED STATES PATENTS

| | | |
|---|---|---|
| 2,261,700 | Ryznar | Nov. 4, 1941 |
| 2,447,475 | Kaberg | Aug. 17, 1948 |
| 2,546,167 | Salvin | Mar. 27, 1951 |
| 2,640,765 | Easley et al. | June 2, 1953 |
| 2,763,536 | Easley et al. | Sept. 18, 1956 |

OTHER REFERENCES

Soap, July 1951, pp. 43, 45, 47 and 49.